United States Patent [19]

Kubota et al.

[11] Patent Number: 5,330,606
[45] Date of Patent: Jul. 19, 1994

[54] PLASMA SOURCE FOR ETCHING

[75] Inventors: Masafumi Kubota, Osaka; Noboru Nomura, Kyoto; Tokuhiko Tamaki, Sakai, all of Japan

[73] Assignee: Matsushita Electric Industrial Co., Ltd., Kadoma, Japan

[21] Appl. No.: 805,864

[22] Filed: Dec. 10, 1991

[30] Foreign Application Priority Data

Dec. 14, 1990 [JP] Japan ................................ 2-402319
Feb. 25, 1991 [JP] Japan ................................ 3-30019

[51] Int. Cl.$^5$ .......................................... H01L 21/00
[52] U.S. Cl. ................................. 156/345; 156/643; 204/298.06; 204/298.34
[58] Field of Search ............... 156/345, 643; 118/723, 118/723 E, 723 ER; 204/298.06, 298.34

[56] References Cited

U.S. PATENT DOCUMENTS

| 4,668,338 | 5/1987 | Maydan et al. ................. 156/345 X |
| 4,954,201 | 9/1990 | Latz et al. ..................... 204/298.31 X |
| 4,975,144 | 12/1990 | Yamazaki et al. ............... 156/345 X |
| 5,078,851 | 1/1992 | Nishihata et al. ............... 156/345 X |

FOREIGN PATENT DOCUMENTS

| 56-33839 | 4/1981 | Japan ................................ 156/345 |
| 60-153129 | 8/1985 | Japan . | |
| 61-67920 | 4/1986 | Japan ................................ 156/345 |
| 62-114230 | 5/1987 | Japan ................................ 156/345 |
| 1-04786 | 4/1989 | Japan ................................ 156/345 |
| 1-106432 | 4/1989 | Japan ................................ 156/345 |
| 2-38573 | 2/1990 | Japan ............................. 118/723 E |
| 3-30424 | 2/1991 | Japan . | |
| 4-61119 | 2/1992 | Japan ................................ 156/345 |
| 4-107826 | 4/1992 | Japan ............................. 118/723 E |
| 5-51172 | 7/1993 | Japan . | |

Primary Examiner—Brian E. Hearn
Assistant Examiner—Jonathan D. Baskin
Attorney, Agent, or Firm—Ratner & Prestia

[57] ABSTRACT

An apparatus for generating plasma is disclosed. The apparatus comprises: a plasma chamber; pairs of parallel plate electrodes; and a power supply for applying high-frequency powers on the pairs of electrodes. The frequencies of the high-frequency powers and the phase difference between the high-frequency powers are adjusted so as to cause each of electrons in the plasma to move in a circular path. A dense and highly uniform plasma is generated at a low pressure level, by utilizing the phenomenon of the oscillation, revolution or cycloidal motion of electrons in a high-frequency electric field formed between the parallel plate electrodes. This plasma is suitable for etching in the LSI fabrication process.

11 Claims, 11 Drawing Sheets $\phi = 0$ $\phi = 45°$ $\phi = 90°$ $\phi = 135°$ $\phi = 180°$

| | PRIOR ART | | | EMBODIMENTS |
|---|---|---|---|---|
| | PARALLEL PLATE RIE | MAGNETRON RIE | ECR ETCHING | |
| ANISOTROPY | △ | ○ | ○ | ○ |
| UNIFORMITY | ○ | △ | △ | ○ |
| DAMAGE | △ | △ | ○ | ○ |
| SELECTIVITY | △ | ○ | ○ | ○ |
| ETCH RATE | △ | ○ | △ | ○ |
| LARGER WAFER SIZE | ○ | △ | △ | ○ |

PLASMA SOURCE FOR ETCHING

BACKGROUND OF THE INVENTION

1. Field of the Invention

The present invention relates to a plasma technology, and more particularly, to a plasma source for processing in the field of semiconductor fabrication technology.

2. Description of the Prior Art

The progress in the large scale integrated circuit (LSI) technology is bringing about a change comparable to that of the industrial revolution. A high packing density of the LSI has been realized through a reduction in the device dimensions, an improvement in device structures and enlargement of chip surface areas. In recent years, the device dimensions has been reduced to the light wavelength region, and the use of excimer laser or soft x-rays in lithography is being studied.

In the field of semiconductor fabrication processing, the plasma technology is widely used for dry etching, chemical vapor deposition, sputtering and so on. Especially, dry etching technique plays an important role in the formation of fine patterns, as well as lithography technique.

Dry etching is a process for removing unnecessary portions of the solid surface (e.g., a surface of a semiconductor substrate, layers deposited on a substrate, and so on) by utilizing chemical or physical reactions at the interface between plasma and the solid surface. The plasma-solid surface reactions are induced by the interaction between the solid surface and free radicals, ions, etc., generated in the plasma.

Reactive ion etching (RIE), which is the most widely used as a dry etching technique, removes the unnecessary portions of the surface of the sample by an etching reaction that occurs when the sample is exposed to the high-frequency discharge plasma of a suitable gas. The necessary portions are normally protected by a photoresist pattern used as a mask. In order to improve the fineness of the pattern, it is necessary to align the directionality of the ions. This cannot be achieved without reducing the ion scattering in the plasma. In making the directionality of the ions uniform, decreasing the pressure of plasma is effective in increasing the mean free path of the ions. However, it is difficult for a low pressure gas to be discharged by a high-frequency power (A.C. power). To solve this problem, magnetron reactive ion etching and electron cyclotron resonance (ECR) etching techniques, in which a magnetic field is applied on the plasma chamber, have been developed to generate a low pressure gas discharge.

FIG. 14 shows a typical prior art magnetron discharge etcher for reactive ion etching (RIE). In this etcher, a gas controller 82 passes into a metal chamber 81 and introduces the reactive gas, while the pressure is appropriately controlled by an exhaust system 83. An anode 84 is provided at the top of the chamber 81. A sample stage 85 (which serves as a cathode) is provided at the bottom. An RF power source 87 is connected to the sample stage 85 via an impedance-matching circuit 86 to facilitate a high-frequency discharge between the sample stage 85 and the anode 84. A rotating magnetic field is applied in the chamber 81 by a pair of opposing AC electromagnets 88 mounted on the sides and whose phases are shifted 90 degrees from each other, thus facilitating a discharge at a low pressure. The cycloid motion of the electron induced by the magnetic field improves ionization efficiency.

Although the purpose of using the above magnetron discharge and ECR discharge is to increase the plasma density, the discharges are still not sufficiently capable of generating uniformly a highly dense plasma over the entire surface of the sample. In the prior art magnetron reactive ion etching etcher, local plasma densities are regarded as uniform by means of a rotating magnetic field when averaging them over long time. In fact, however, the instantaneous plasma densities are not uniform. Therefore, when a wafer is exposed to the plasma for the fabrication of MOSLSI in the prior art etcher, local potential differences of the plasma may cause the gate oxide film of the MOSLSI to break down. In the ECR etcher, a magnetic field is distributed radially in the chamber, so that the local deviation in the plasma density occurs and it causes a non-uniform etching and local potential differences.

Due to the non-uniformity of the plasma generated in the prior art etcher, it is difficult to achieve a high-yield production of MOSLSI. Further, it is difficult to achieve a high repeatability in the etching of ultrafine-pattern LSI devices having thin gate oxide films and the etching of a large sample (e.g., a large-diameter wafer).

To generate a high-density plasma, and to lower the self-bias in the plasma for reducing damage to the sample caused by high energy ions, a high-frequency power (ranging from 100 to 200 MHz) may be superimposed with a 13.56 MHz power on the parallel plate electrode of the magnetron etcher. Even in this method, it is difficult to improve the uniformity of the plasma. Therefore, it is not sufficient to solve the problems caused by The non-uniform plasma.

SUMMARY OF THE INVENTION

The apparatus for generating plasma of this invention, which overcomes the above-discussed and numerous other disadvantages and deficiencies of the prior art, comprises: a plasma chamber; a pair of electrodes for generating plasma in said plasma chamber; and power supply means for applying a high-frequency power on said pair of electrodes, the period of the high-frequency power being shorter than the time required for electrons contained in said plasma To travel between said pair of electrodes.

In a preferred embodiment, said high-frequency power has the frequency of 50 MHz or more.

According to the invention, an apparatus for generating plasma is provided, said apparatus comprising: a plasma chamber; at least three electrodes for generating plasma in said chamber, each one of said electrodes facing toward the others; and power supply means for applying high-frequency powers on at least two pairs of said electrodes, the frequency of each of said high-frequency powers being an integral multiple of the lowest frequency among said high-frequency powers, the phases of said high-frequency powers having a fixed relation with each other.

According to the invention, an apparatus for generating plasmas provided, said apparatus comprising: a plasma-chamber; a first pair of parallel plate electrodes: a second pair of parallel plate electrodes, said second pair of parallel plate electrodes being substantially perpendicular with said first pair of parallel plate electrodes; and power supply means for applying high-frequency powers on said first and second pairs of said electrodes, the frequency of each of said high-frequency powers being an integral multiple of the lowest frequency among said high-frequency powers, the phase difference between said high-frequency powers applied on said first and second pairs of said electrodes being 90 degrees.

According to the invention, an apparatus for generating plasma is provided, said apparatus comprising: a plasma chamber; a first pair of parallel plate electrodes; a second pair of parallel plate electrodes, said second pair of parallel plate electrodes being substantially perpendicular with said first pair of parallel plate electrodes; a third pair of parallel plate electrodes, said third pair of parallel plate electrodes being substantially perpendicular with said first pair of parallel plate electrodes and said second pair of parallel plate electrodes; and power supply means for applying high-frequency powers on said first, second and third pairs of said electrodes, the frequency of each of said high-frequency powers being an integral multiple of the lowest frequency among said high-frequency powers, the phase differences between said high-frequency powers applied on said first, second and third pairs of said electrodes being 120 degrees.

In a preferred embodiment, said apparatus further comprises magnetic field applying means for forming a magnetic field to confine the plasma.

In a preferred embodiment, said power supply means comprises: a single signal source for producing a high-frequency signal; at least two amplifiers for receiving said high-frequency signal from said single signal source and amplifying said high-frequency signal to said high-frequency powers; and a phase locking controller for fixing the phase difference between said high-frequency powers.

According to the invention, a plasma etcher is provided, said plasma etcher comprising: a chamber; a pair of electrodes for generating plasma in said chamber; a holder for holding at least one wafer, said holder disposed in said chamber for exposing the surface of said wafer to said plasma; and power supply means for applying a high-frequency power on said pair of electrodes, the period of the high-frequency power being shorter than the time required for electrons contained in said plasma to travel between said pair of electrodes.

In a preferred embodiment, said high-frequency power has the frequency of 50 MHz or more.

According to the invention, a plasma etcher is provided, said plasma etcher comprising: a chamber; at least three electrodes for generating plasma in said chamber, each one of said electrodes facing toward the others; a holder for holding at least one wafer, said holder disposed in said chamber for exposing the surface of said wafer to said plasma; and power supply means for applying high-frequency powers on at least two pairs of said electrodes, the frequency of each of said high-frequency powers being an integral multiple of the lowest frequency among said high-frequency powers, the phases of said high-frequency powers having a fixed relation with each other.

According to the invention, a plasma etcher is provided, said plasma etcher comprising: a chamber; a first pair of parallel plate electrodes: a second pair of parallel plate electrodes, said second pair of parallel plate electrodes being substantially perpendicular with said first pair of parallel plate electrodes; power supply means for applying high-frequency powers on said first and second pairs of said electrodes, a holder for holding at least one wafer, said holder disposed in said chamber for exposing the surface of said wafer to plasma; and the frequency of each of said high-frequency powers being an integral multiple of the lowest frequency among said high-frequency powers, the phase difference between said high-frequency powers applied on said first and second pairs of said electrodes being 90 degrees.

According to the invention, a plasma etcher is provided, said plasma etcher comprising: a chamber; a first pair of parallel plate electrodes; a second pair of parallel plate electrodes, said second pair of parallel plate electrodes being substantially perpendicular with said first pair of parallel plate electrodes; a third pair of parallel plate electrodes, said third pair of parallel plate electrodes being substantially perpendicular with said first pair of parallel plate electrodes and said second pair of parallel plate electrodes; and power supply means for applying high-frequency powers on said first, second and third pairs of parallel plate electrodes, the frequency of each of said high-frequency powers being an integral multiple of the lowest frequency among said high-frequency powers, the phase differences between said high-frequency powers applied on said first, second and third pairs of parallel plate electrodes being 120 degrees, one of said parallel plate electrodes functioning as a holder for holding at least one wafer for exposing said wafer to plasma.

In a preferred embodiment, said plasma etcher further comprises magnetic field applying means for forming a magnetic field to confine the plasma.

In a preferred embodiment, said power supply means comprises: a single signal source for producing a high-frequency signal; at least two amplifiers for receiving said high-frequency signal from said single signal source and amplifying said high-frequency signal to said high-frequency powers; and a phase locking controller for fixing the phase difference between said high-frequency powers.

In a preferred embodiment, the temperature of said holder is the lowest in said chamber.

In a preferred embodiment, an electronegative gas is introduced into said chamber, and is discharged by said high-frequency powers for generating the plasma.

In a preferred embodiment, said electronegative gas includes a gas selected from the group of $SF_6$, $Br_2$, $Cl_2$, $I_2$ and $O_2$.

In a preferred embodiment, said plasma etcher further comprises bias supplying means for applying a bias on said holder.

In a preferred embodiment, said bias supplying means includes, means for applying an AC power on said holder for generating a DC bias.

In a preferred embodiment, said bias supplying means starts to apply a bias on said holder after the plasma is generated.

In a preferred embodiment, said plasma etcher further comprises a temperature controller for controlling the temperature of said holder.

In a preferred embodiment, said plasma etcher further comprises: at least one magnetic field strength detected for detecting the strength of magnetic field formed by motions of electrons of the plasma; and means for controlling said high-frequency powers according to said strength of the magnetic field.

According to the invention, a method of increasing the uniformity of plasma is provided, in which electrons in the plasma are caused to move in circular paths by applying an electric field on said electrons, said electric field being formed by combining at least two high-frequency electric fields, the phase difference of said at least two high-frequency electric fields being fixed at constant.

According to the invention, a method for plasma etching is provided, in which electrons in plasma are caused to move in circular paths by applying an electric field on said electrons, said electric field being formed by combining at least two high-frequency electric fields, the phase difference of said at least two high-frequency electric fields being fixed at constant, and a sample to be etched is exposed to said plasma for being etched.

Thus, the invention described herein makes possible the objectives of (1) providing an apparatus for generating a dense and highly uniform plasma at a low pressure; (2) providing a plasma etcher for achieving superior fine patterning and good uniformity at a low pressure without breakdown of thin insulators of etched devices; (3) providing a method of increasing the uniformity of plasma; and (4) providing a method for plasma etching in which a sample is etched uniformly without being damaged.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
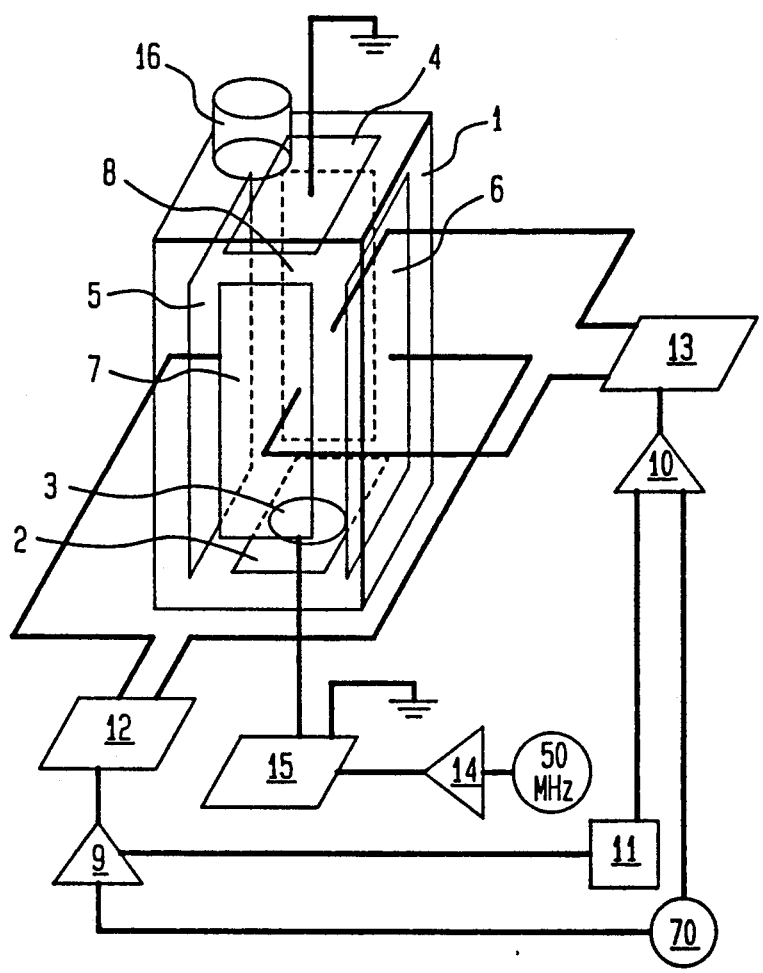
FIG. 1 is a diagram showing the configuration of a plasma etcher of a first embodiment according to the invention.

FIG. 1 shows a plasma etcher of a first embodiment according to the invention. The plasma etcher comprises: an etching chamber (plasma chamber) 1; a first pair of parallel plate electrodes 5 and 6; and a second pair of parallel plate electrodes 7 and 8. The two pairs of parallel plate electrodes 5, 6, 7 and 8 are arranged in the chamber 1 so that the second pair of parallel plate electrodes 7 and 8 are substantially perpendicular with the first pair of parallel plate electrodes 5 and 6, as shown in FIG. 1. On each of the two pairs of the parallel plate electrodes 5, 6, 7 and 8, a 300 MHz high-frequency power is applied. The phase of the 300 MHz high-frequency power applied between the parallel plate electrodes 5 and 6 differs by approximately 90 degrees from the phase of the power applied between the parallel plate electrodes 7 and 8. The plasma etcher further comprises a sample stage (holder) 2 serving as a parallel plate electrode on which a 50 MHz high-frequency power is applied, and an opposing electrode 4. The sample stage 2 supports a sample (a semiconductor wafer) to be etched. In the space surrounded by the sample stage 2 and the parallel plate electrodes 4 to 8, the plasma is generated. The etching gas is introduced into the chamber 1 through a mass flow controller (not shown) and an inlet (not shown) of The chamber 1. The internal pressure of the chamber is maintained at 0.1 to 10 Pa by a turbo pump (not shown).

Amplifiers 9 and 10 supply high-frequency power to the parallel plate electrodes 5, 6, 7 and 8 via matching circuits 12 and 13. The amplifiers 9 and are controlled by a phase-locking mechanism 11 so that there is a fixed phase difference (90 degrees) between the high-frequency powers. In order to make the frequencies of the high-frequency powers equal, a signal generated by a single signal source 70 is used. The signal is amplified to the high-frequency powers having the same frequency and different phases in the amplifiers 9 and 10. Further, a 50 MHz high-frequency power is amplified by an amplifier 14 and supplied to the sample stage 2 through a matching circuit 15.

As explained below, the force exerted on an electron in the plasma by the electric field formed between the two pairs of parallel plate electrodes 5 to 8 causes the electron to move in a circular path. The circular motions of many electrons generate a magnetic field which is detectable by using a magnetic field detector such as a Hall element. The strength of the magnetic field is proportional to the plasma density (the electron density). Therefore, in order to control the plasma density, the high-frequency power applied on the parallel plate electrodes 5 to 8 can be adjusted according to the magnetic field strength measured by a Hall element 16 which is attached to the plasma etcher.

Figure 2A:
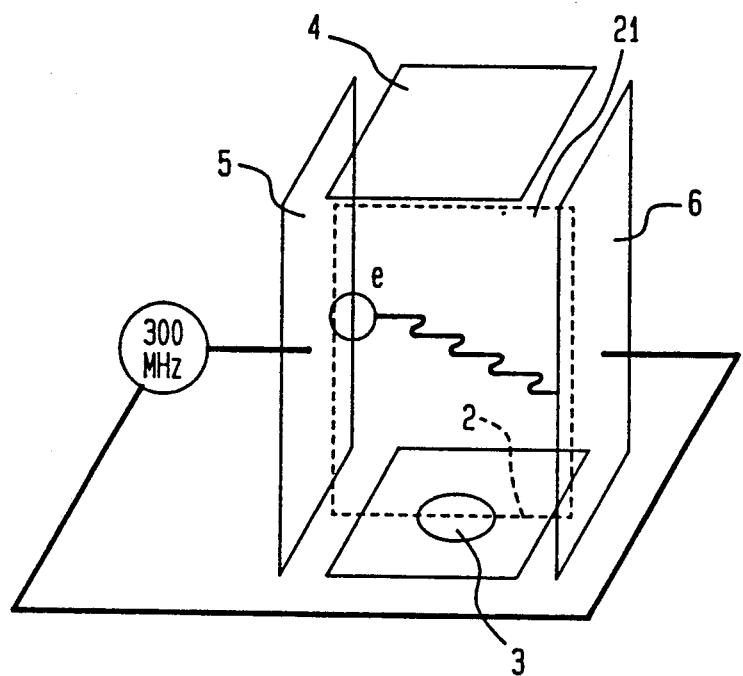
FIGS. 2A and 2B are diagrams for explaining the path of electron in the chamber of the plasma etcher of the first embodiment.
Figure 2B:
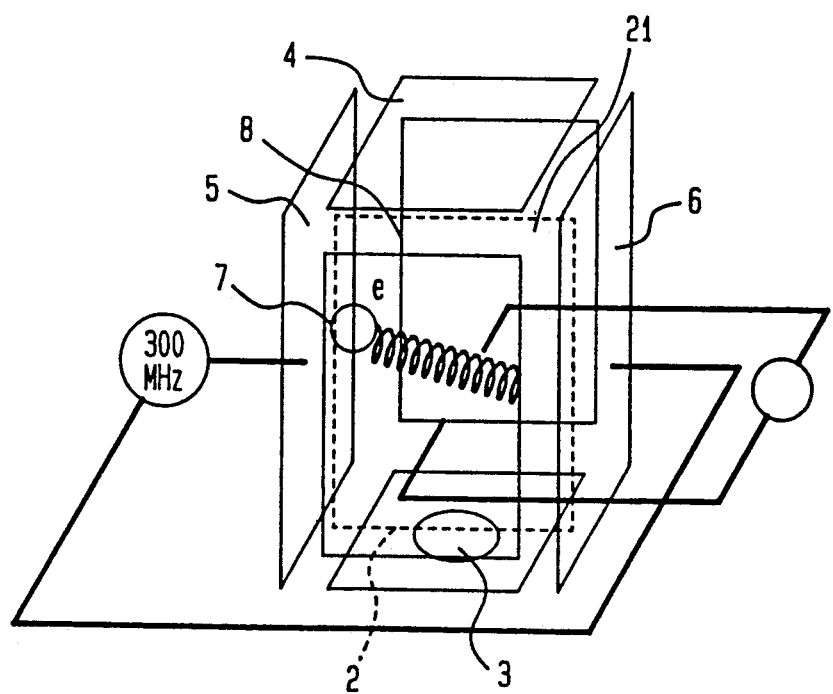

Referring now to FIGS. 2A and 2B, electron motions in the plasma etcher of the invention is explained below. FIG. 2A shows the typical path of an electron e when a high-frequency power is applied on the pair of parallel plate electrodes 5 and 6. The electron e moves in the direction of its initial electron velocity (which depends on the magnitude of the kinetic momentum of the electron) while being oscillated by the high-frequency electric field between the electrodes 5 and 6.

Figure 3:
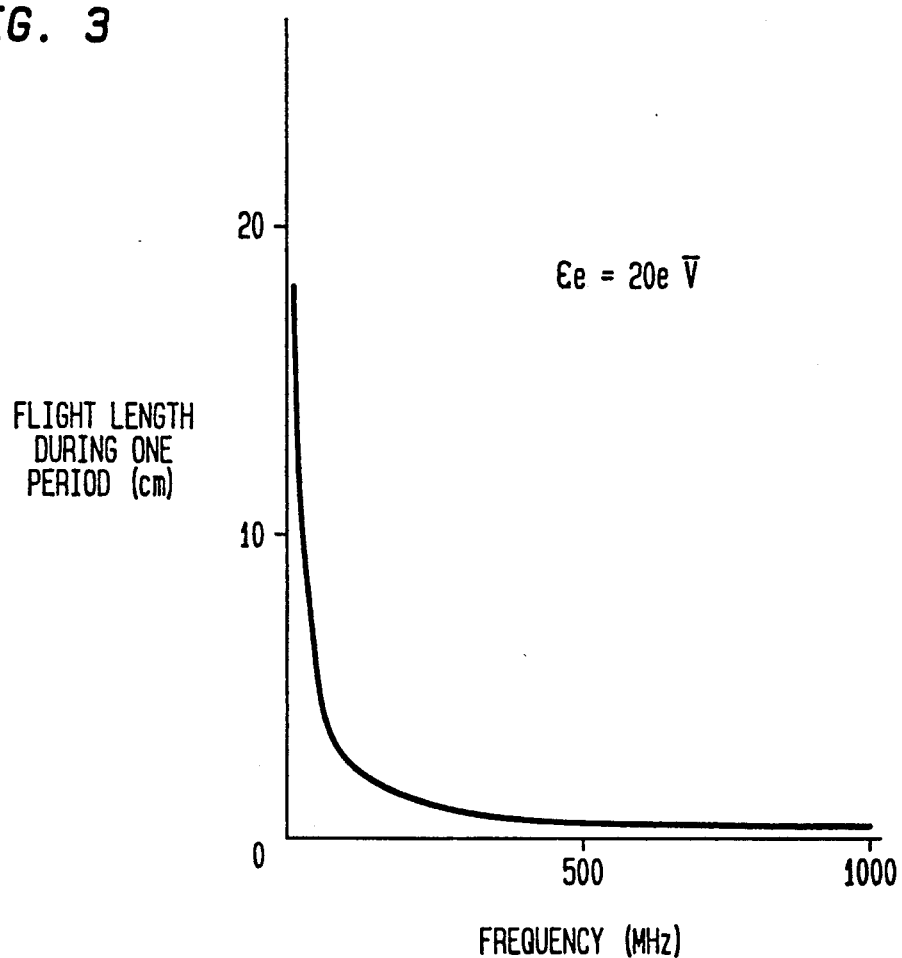
FIG. 3 is a graph showing the dependence of the distance electrons travel in one period on frequency.
Figure 4A:
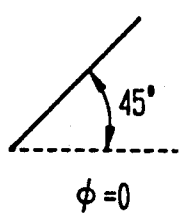
FIGS. 4A through 4E are diagrams showing the relationship between phase difference (Φ) and Lissajous waveforms.
Figure 4B:
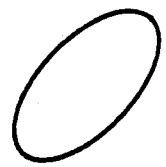
Figure 4C:
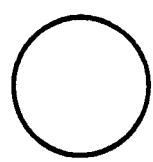
Figure 4D:
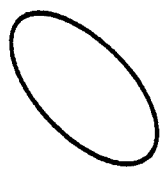
Figure 4E:

FIG. 3 shows the distance the electron having an energy of 20 eV travels during one period of the high frequency power, as a function of the frequency. For example, an electron traveling in the X direction with an energy of 20 eV moves approximately 6 cm in 20 nanoseconds (one period of the 50 MHz high-frequency power). Assuming the distance between parallel plate electrodes 5 and 6 is 30 cm, then the electron oscillates approximately five times while traveling the distance. Since an electron having a larger energy travels at a higher speed, the number of the oscillations is decreased.

To ionize a gas, the electron energy of about 15 eV or greater is generally required, although it depends on the kinds of the gas. Ionization of the gas occurs as a result of collisions between electrons and gas molecules (neutrals). Since the probability for the collision increases as the free path of the electrons in a unit time increases, ionization efficiency is increased as the free path of the electrons increases. According to the invention, the free path of the electrons in a unit time is increased by causing the electrons to oscillate or to move in a circular path by means of a high-frequency electric field without applying a magnetic field, thereby improving ionization efficiency. It can also be thought of as effectively increasing the collision cross section with the gas molecules by the oscillation or revolution of the electrons.

Since the distance between the parallel plate electrodes 5 and 6 is normally several tens of centimeters, a high frequency greater than approximately 50 MHz is required to improve ionization efficiency. However, even if the free paths of electrons are not increased by a frequency lower than 50 MHz, the probability of their colliding with the chamber wall and being annihilated decreases with the oscillation or revolution of lower energy electron. Therefore, a decrease in electron density is prevented and ionization efficiency remains high.

A high-frequency power of 50 MHz or greater is used only for a microwave discharge in prior art plasma etchers. The frequency of a microwave power supplied from a magnetron is in the gigahertz band.

FIG. 2B shows electron motion in the electric field formed when the high-frequency powers of the same frequency and whose phases differ by 90 degrees are applied on the two pairs of parallel plate electrodes 5 to 8. The path of the electron e, as shown in FIG. 2B, is the same as the so-called Lissajous waveform seen when signals of the same frequency whose phases are shifted 90 degrees are input to the X signal input end Y signal input of an oscilloscope. The Lissajous waveform becomes a different wave due to the phase difference ($\Phi$) of the high-frequency powers input to X and Y. The relationship between the phase difference ($\Phi$) and the Lissajous waveform is shown in FIGS. 4A to 4E. Thus, ionization efficiency is improved by using the electric field to oscillate or to move the electron in a circular path.

Figure 5A:
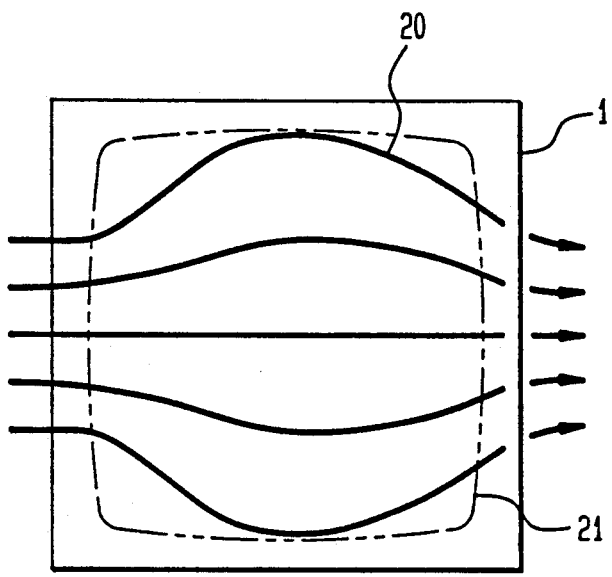
FIGS. 5A and 5B are diagrams showing the magnetic flux distribution and the electron motions in a prior ark magnetron etcher.
Figure 5B:
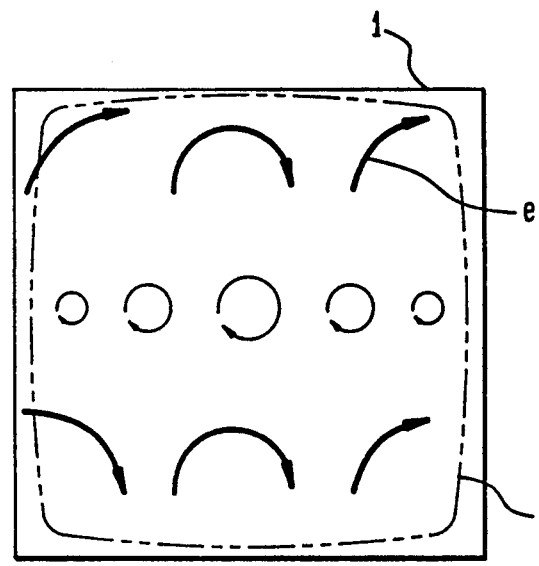

AS shown in FIG. 5A, in a prior art magnetron etcher using a rotating magnetic field, the magnetic flux distribution 20 immediately above the sample stage at a certain instant would be non-uniform. Since the radius of the path of the electrons e (black dots in FIG. 5B) is inversely proportional to the strength of the magnetic field, the radius of the path of the electrons e increases in size where the magnetic field is weak, and so the electrons e readily collide with the chamber wall and are annihilated. This reduces the electron density in locations where the magnetic field is weak and, in turn, lowers the plasma density. In the prior art magnetron etcher, non-uniformities in the plasma density occur and result in non-uniform etching and damage to the sample 3 being etched.

Figure 6:
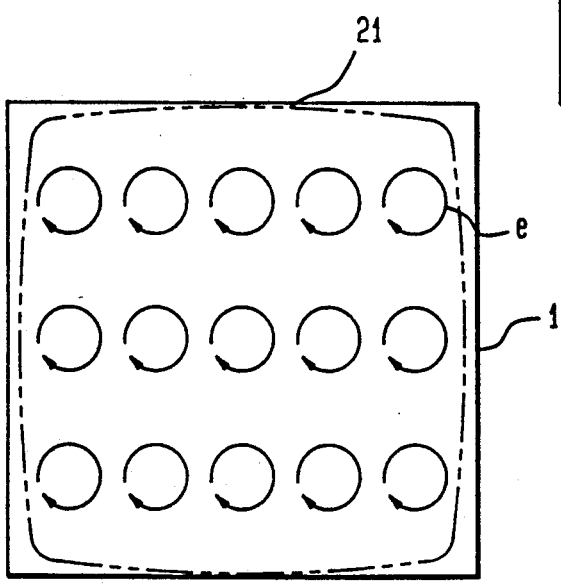
FIG. 6 is a diagram showing the electron motions in a plasma etcher of the invention.

In the plasma etcher of the invention, the electric field is uniform in the entire area between the parallel plate electrodes 5, 6, 7 and 8. Therefore, the radius of the electron path is equal everywhere as shown in FIG. 6, thus making the plasma density equal throughout the entire plasma generation area 21. The reaction products (e.g., etchants) generated from the reactive gas plasma in the plasma generation area 21 impinges uniformly on the entire surface of the sample 3 (not shown in FIG. 6). This results in uniform etching of the entire sample facing the plasma generation area 21 end little damage to the sample 3 due to the charge build-up. Moreover, a high plasma density provides a fast etching rate.

Figure 7A:
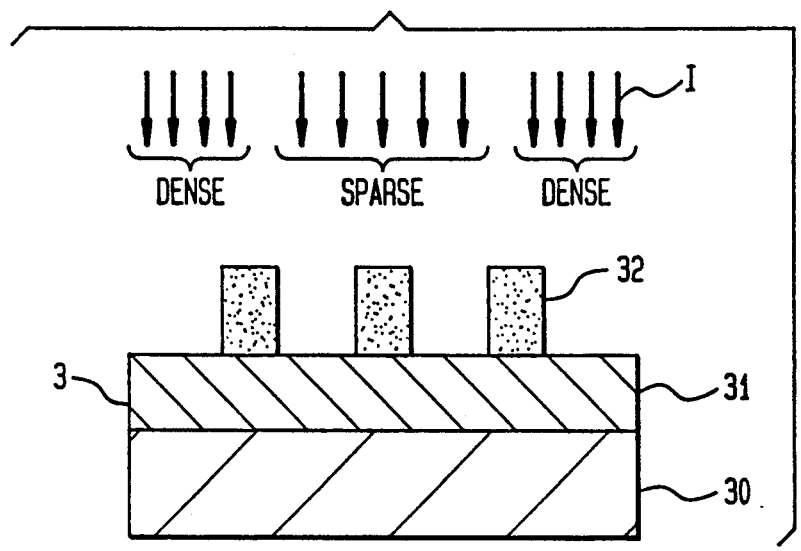
FIG. 7A is a cross section of a sample to be etched.
Figure 7B:
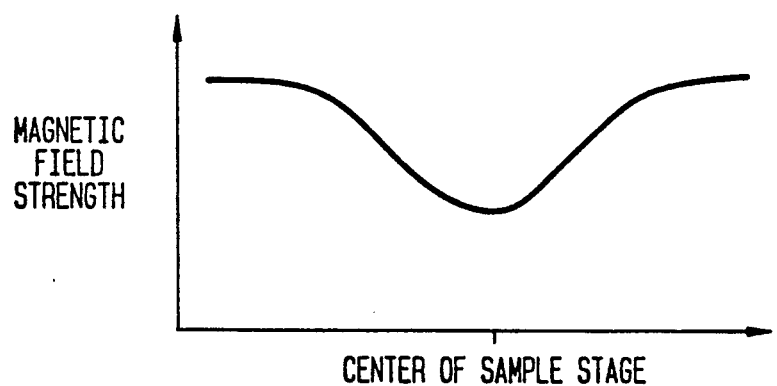
FIGS. 7B and 7C are graphs for showing a magnetic field strength distribution and an etch rate distribution in a prior art magnetron etcher.
Figure 7C:
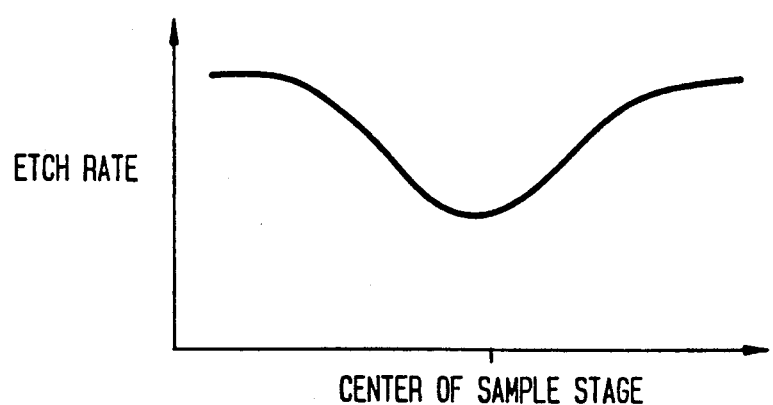

FIG. 7A shows an etching process in the prior art magnetron etcher using the rotating magnetic field. As shown in FIG. 7A, a boro-phospho silicate glass (BPSG) 31 formed on a silicon substrate 30 is exposed, as a sample to be etched, to the plasma in the magnetron etcher. Portions of the BPSG 31 are covered with a photoresist pattern 32. According to the magnetron etcher using the rotating magnetic field, the magnetic field is not uniform. As shown in FIG. 7B, when the magnetic field intensity immediately above the silicon substrate 30 is at a minimum in the center of the sample stage (not shown in FIG. 7B), the flux I of the ions (reaction products for etching) which impinge on the center surface of the silicon substrate 30 is sparse as shown in FIG. 7A. This is because the flux I of the ions is proportional to the plasma density distribution corresponding to the magnetic field intensity distribution. The etching rate of the BPSG 31 nearly follows the ion flux I and becomes non-uniform, as shown in FIG. 7C. Further, non-uniformities of the plasma density also bring about damage due to deviations in a charge distribution.

Figure 8A:
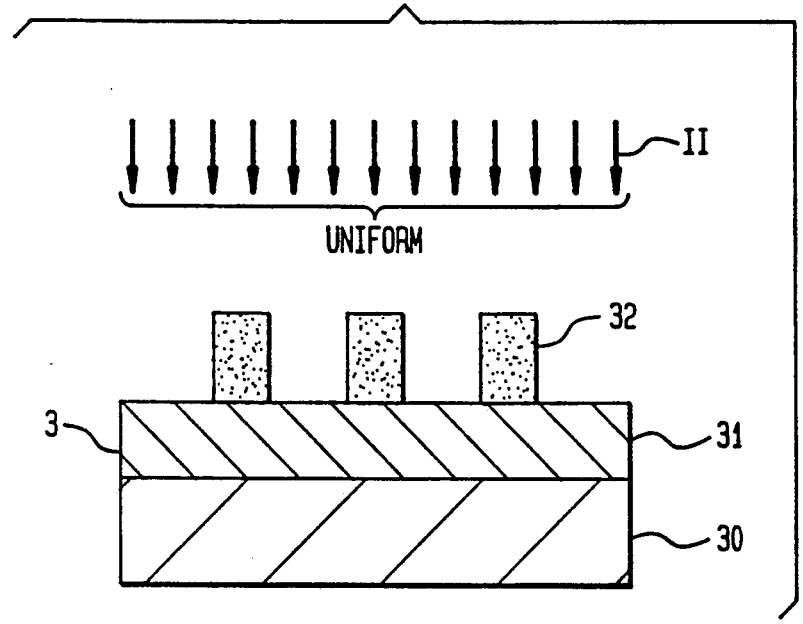
FIG. 8A is a cross section of a sample to be etched.
Figure 8B:
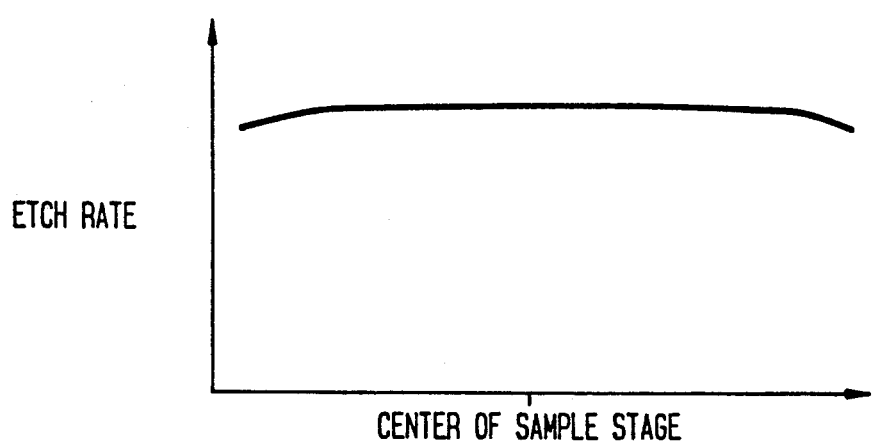
FIG. 8B is a graph for showing an etch rate distribution in a plasma etcher of the invention.

As shown in FIG. 8A, in the plasma etcher of the invention, a uniform plasma is generated as described above. Therefore, the flux II of the ions which impinge on the surface of the silicon substrate 30 is also uniform. This results in a highly uniform etching rate as shown in FIG. 8B. Also, there Is little deviation of the charge build-up, so that there is very little damage to devices on the wafer to be etched.

In the etching process using the plasma etcher of the invention, we used a gas containing $CHF_3+O_2$, $CF_4+CH_2F_2$, or other Freon gas as a base gas. The gas was introduced into the chamber and the pressure was set at 0.1 to 10 Pa. The etching rate was 100 to 350 nm/min.

The method of etching according to the invention is particularly suited to the formation of submicron patterns and the etching of large-diameter semiconductor wafers 6 or 8 inches across. This is because the pressure in the chamber can be kept low in the method. That is, there is little ion scattering under the low pressure conditions and the etching rate does not depend on pattern size. This results in little pattern shift (so-called CD loss) from the photoresist pattern in the etching process. It is also because the chamber can be easily made large without decreasing the uniformity of the plasma.

In another experiment using the plasma etcher of the invention, a gas was used in which a small amount of oxygen was mixed with $SF_6$, so as to etch a phosphorous-doped polycrystalline silicon.

The high effectiveness of the invention was confirmed from experimental results when an electronegative gas such as $SF_6$, oxygen, chlorine and iodine was used as an etching gas. Since the electron density is low and the resistance is high in the high-frequency plasma of the electronegative gas, the potential gradient in the plasma is large compared to that of an electropositive gas plasma, and so the effectiveness of the invention is particularly great.

In this case, as well, the electric field formed between the parallel plate electrodes is uniform. Therefore, a uniform plasma is obtained, which yields uniform etching. Also, since there are almost no local deviations in the plasma, damage to the device such as breakdown of the gate oxide in MOSLSI is greatly decreased. Moreover, etching rates of 200 to 400 nm/min are also obtained.

The strength of the magnetic field generated by the revolution of the electrons in the plasma is detected by the Hall element 16. Since the magnetic field strength is proportional to the plasma density (electron density), the condition of the plasma is maintained constant by increasing or decreasing the high-frequency power so that the measured intensity of the magnetic field remains at a set level. By this means, a good plasma condition can be reproduced since control is performed by direct feedback from the plasma condition.

Although the oxide film and polycrystalline silicon are etched using the plasma etching technique according to the invention, other materials, for example, silicon compounds, metals such as Aluminum alloys, or an individual resists in multilayer resists may be etched. In these cases, effectiveness of the invention is further improved when such electronegative gases as $SF_6$, $Br_2$, $Cl_2$, $I_2$ and $O_2$ are used.

Figures 9, 11:
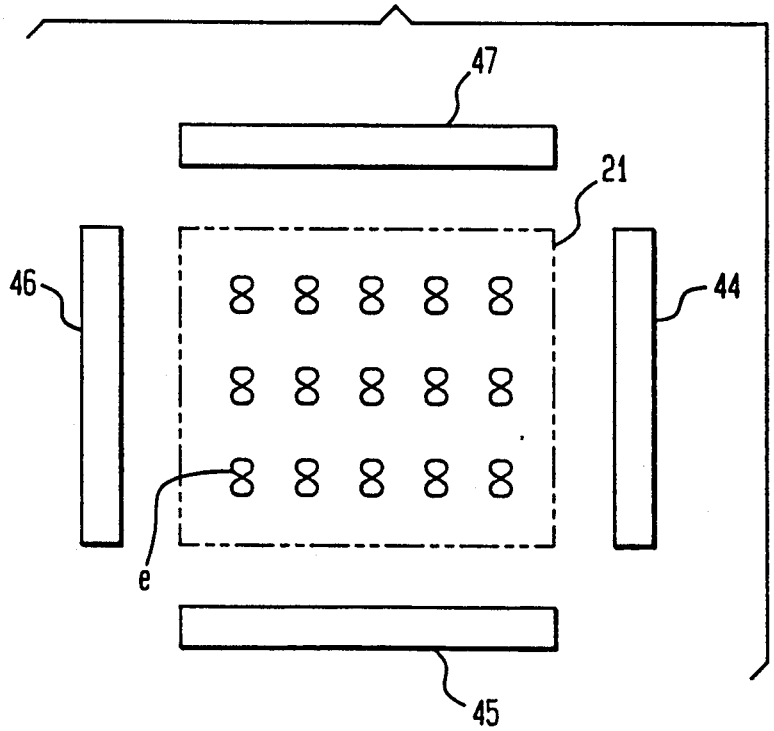
FIG. 9 is a table showing a comparison of the plasma etcher of the invention with the prior art plasma etcher.
FIG. 11 is a diagram for explaining the path of electrons in the chamber of the plasma etcher of the second embodiment.

FIG. 9 shows a comparison of characteristics of a prior art dry etching with those of the dry etching of the invention. It can be seen that the dry etching of the invention is far superior to the prior art method.

As described above, according to this embodiment, a high-frequency power of a first frequency is applied on the first opposing electrodes 5 and 6 and a high-frequency power of the first frequency with a phase shifted approximately 90 degrees from that for the parallel plate electrodes 5 and 6 is applied on the second opposing electrodes 7 and 8 to cause the electrons in plasma generation area to move in a circular (includes elliptical) path, whereby a high-density, highly uniform plasma is generated in spite of a low pressure, and by controlling the application of the 50 MHz high frequency power on the sample stage 2, the selectivity ratio to the substrate could be controlled during etching. Further, since there is almost no local deviations in the plasma, damage to the etched sample can be greatly decreased.

In this embodiment, the phase difference between the high-frequency powers was fixed at 90 degrees because this provides the greatest power input efficiency. However, the invention is still effective at phase differences other than 90 degrees.

Figure 10:
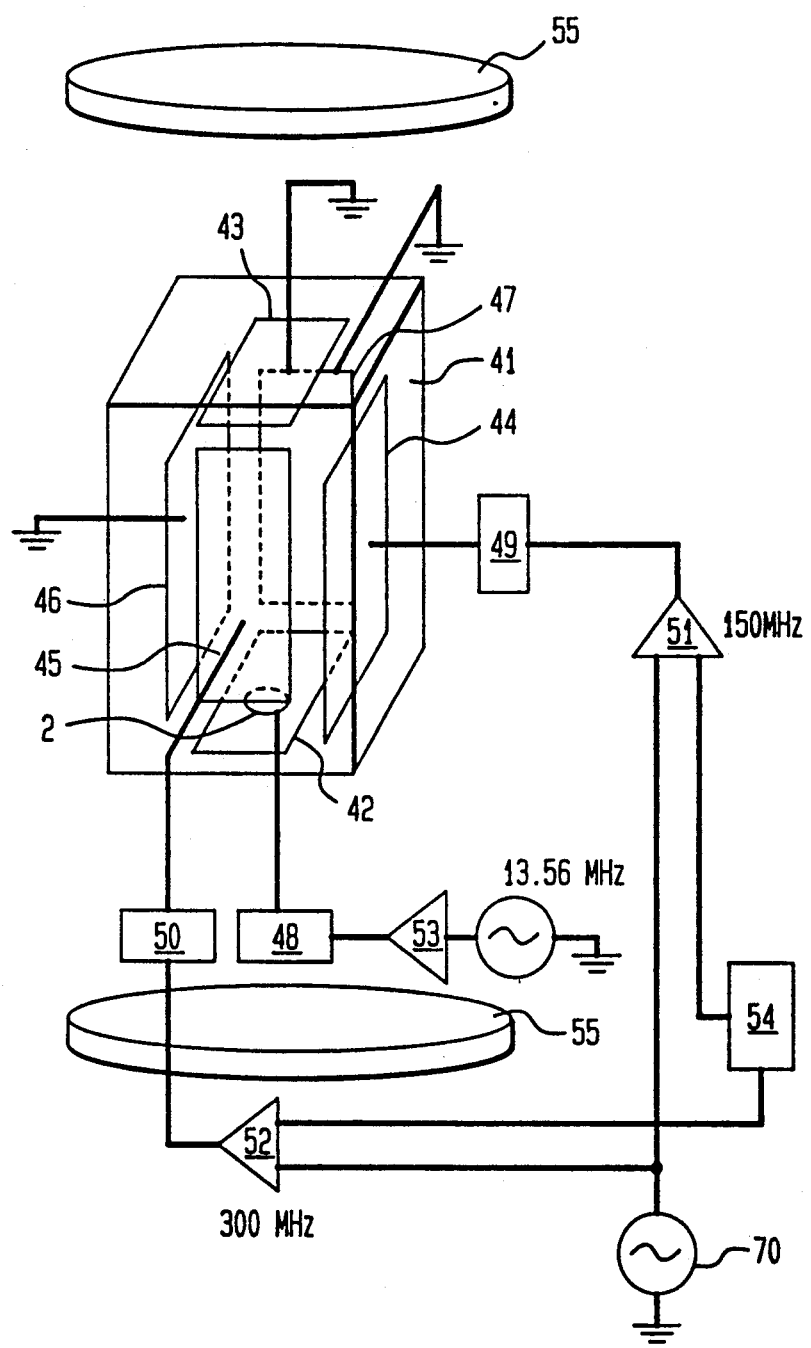
FIG. 10 is a diagram showing the configuration of a plasma etcher of a second embodiment according to the invention.

FIG. 10 shows a plasma etcher of a second embodiment according to the invention. The plasma etcher comprises: an etching chamber (plasma chamber) 41; a first pair of parallel plate electrodes 44 and 46; and a second pair of parallel plate electrodes 45 and 47. The two pairs of parallel plate electrodes 44, 45, 46 and 47 are arranged in the chamber 41 so that the second pair of parallel plate electrodes 45 and 47 are substantially perpendicular with the first pair of parallel plate electrodes 44 and 46, as shown in FIG. 10. On each of the parallel plate electrodes 44 and 45, a 150 MHz high-frequency power and 300 MHz high-frequency power are applied respectively. The parallel plate electrodes 46 and 47 are grounded. The phase of the high-frequency power applied on the parallel plate electrode 44 differs by approximately 0 degree from the phase of the power applied on the parallel plate electrode 45. The plasma etcher further comprises a sample stage 42 serving as an electrode on which a 13.56 MHz high-frequency power is applied, and an opposing electrode 43 which is grounded. The sample stage 42 supports a sample (a semiconductor wafer to be etched). In the space surrounded by the sample stage 42 and the parallel plate electrodes 44 to 47, the plasma is generated.

Amplifiers 51 and 52 supply high-frequency powers to the parallel plate electrodes 44 and 45, respectively, via matching circuits 49 and 50. The amplifiers 51 and 52 are controlled by a phase-locking mechanism 54 so that there is a fixed phase difference (0 degree) between the high-frequency power. Although the phases of the powers applied on the parallel plate electrodes 44 and 45 are the same in this embodiment, different phases can be used. A 13.56 MHz high-frequency power is amplified by an amplifier 53 and supplied to the sample stage 42 through a matching circuit 48. Coils 55 surrounding the chamber 41 form a cusp magnetic field, thereby confining the plasma within the center potion of the chamber 41.

The etching gas is introduced into the chamber 41 through a mass flow controller (not shown) and an inlet (not shown). The internal pressure of the chamber is maintained at 0.1 to 10 Pa during etching by a turbo pump (not shown).

In order to maintain the frequency ratio between the two high-frequency powers constant, a signal generated by a single signal source is used. The signal is multiplied and amplified to the high-frequency powers having the different frequencies and phases in the amplifiers 51 and 52.

This embodiment differs from the first embodiment in that the high-frequency powers having different frequencies of 150 MHz and 300 MHz are each applied on the parallel plate electrodes 44 and 45 and the plasma is closed by the cusp magnetic field generated by the coils 55 in the second embodiment.

FIG. 11 shows a plane projection of the path of the electrons e An the chamber of the plasma etcher of the second embodiment. As expected, the high-frequency powers applied on the parallel plate electrodes 44 and 45 cause each of the electrons to move in a circular path (precisely, the shape of a figure eight). According to the embodiment, a high ionization efficiency and a high plasma density are obtained in spite of a low pressure, as well as the first embodiment.

To etch oxide films in the etcher of the second embodiment, we used a gas containing $CHF_3+O_2$, $CF_4+CH_2F_2$ or other Freon gas as a base and set the pressure at 0.1 to 10 Pa. The etching rate in these oases was 150 to 500 nm/min.

As described above, in this embodiment having the three pairs of parallel plate electrodes 42 to 47, the high-frequency power with a first frequency F is applied on the first pair of parallel plate electrodes 44 and 46, the high-frequency power with a second frequency 2F is applied on the second pair of parallel plate electrodes 45 and 47 and a high-frequency power with a different frequency is applied on the third pair of parallel plate electrodes 42 and 43. According to the embodiment, a plasma with good uniformity is obtained and uniform etching is achieved. Further, since there are almost no local deviations, damage to devices such as gate oxide film breakdown is extremely small. In this embodiment, the ground electrodes (46, 47, 43) have the same potential, but the potential of the ground electrodes (46, 47) of the first and second high-frequency power supplies can be different from the potential of the ground electrode (43) of the third high-frequency power supply.

Figure 12:
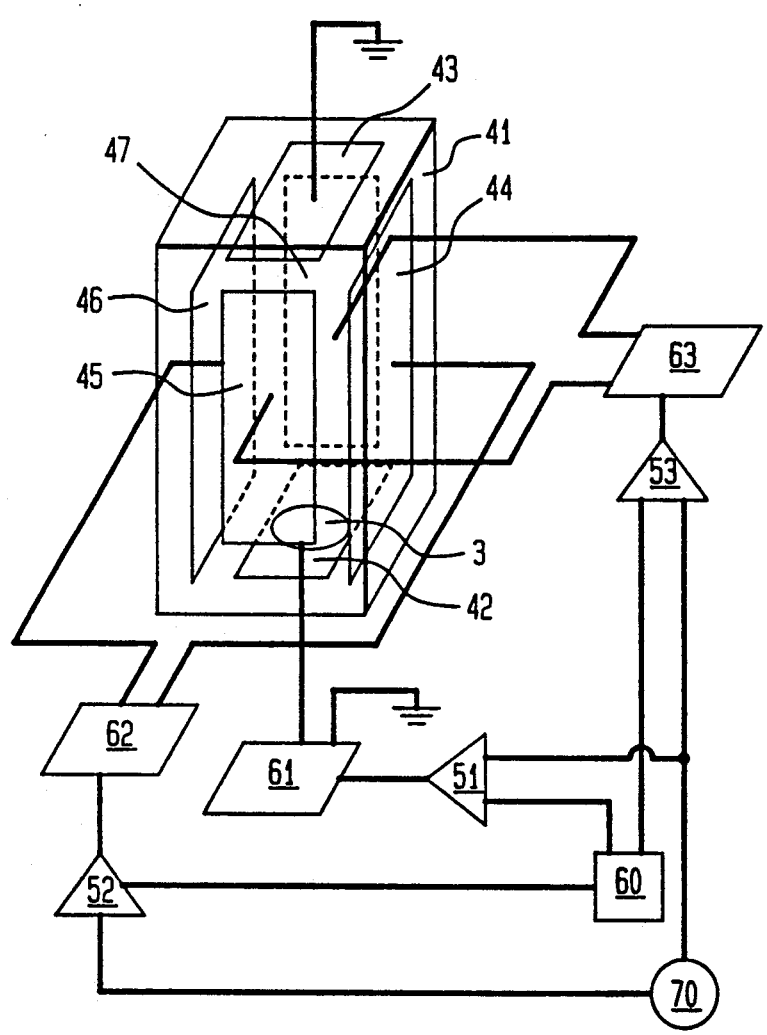
FIG. 12 is a diagram showing the configuration of a plasma etcher of a third embodiment according to the invention.

FIG. 12 shows a plasma etcher of a third embodiment according to the invention. The plasma etcher comprises: an etching chamber (plasma chamber) 41; a first pair of parallel plate electrodes 44 and 46; and a second pair of parallel plate electrodes 45 and 47. The two pairs of parallel plate electrodes 44, 45, 46 and 47 are arranged in the chamber 41 so that the second pair of parallel plate electrodes 45 and 47 are substantially perpendicular with the first pair of parallel plate electrodes 44 and 46, as shown in FIG. 12. On each of the two pairs of the parallel plate electrodes 44, 45, 46 and 47, a 300 MHz high-frequency power is applied.

The plasma etcher further comprises a sample stage 42 serving as an electrode on which a 300 MHz high-frequency power is applied, and an opposing electrode 43 which is grounded. The sample stage 42 supports a sample (a semiconductor wafer) 3 to be etched. In the space surrounded by the sample stage 42 and the parallel plate electrodes 43 to 47, the plasma is generated. The etching gas is introduced into the chamber 41 through a mass flow controller (not shown) and an inlet (not shown). The internal pressure of the chamber is maintained at 0.1 to 10 Pa during etching by a turbo pump (not shown).

Amplifiers 51, 52 and 53 supply high-frequency power to the sample stage 42, the parallel plate electrodes 44 to 47 via matching circuits 61, 62 and 63. The amplifiers 51, 52 and 53 are controlled by a phase-locking mechanism 60 so that there is a fixed phase difference (120 degrees) between the high-frequency powers. Thus, the phases of the powers applied on the parallel plate electrodes 44 and 45 are advanced and delayed, respectively, 120 degrees with respect to that of the power applied on the sample stage 42.

In order to make the frequencies of the high-frequency power equal, a signal generated by a single signal source is used. The signal is amplified to the high-frequency powers (AC powers) having the same frequency and different phases by the amplifiers 51, 52 and 53.

This embodiment differs from the first embodiment in that 300 MHz high-frequency powers whose phases are shifted 120 degrees from each other are applied on the parallel plate electrodes 42, 44 and 45. In this embodiment, the electrons in the chamber are caused to move on a spherical plane by the high-frequency powers. Therefore, a high ionization efficiency and a high plasma density are obtained in spite of a low pressure.

To etch aluminum in the plasma etcher, a gas containing $BCl_3+Cl_2$, $SiCl_4+Cl_2+CHCl_3$ or other chlorine gas as a base was used (the pressure was set at 0.1 to 20 Pa). Under these conditions, an etching rate of 400 to 900 nm/min was obtained. As described above, by means of this embodiment, a mechanism is employed that impresses high-frequency powers of the same frequency and whose phases are shifted 120 degrees form each other on three pairs of parallel plate electrodes, whereby a highly uniform plasma and uniform etching can be obtained. Further, since there are almost no local deviations, damage to devices such as gate oxide film breakdown in MOS devices is extremely small.

In this embodiment, the sample (wafer) 3 to be etched was placed only on the parallel plate electrode 42. Since the parallel plate electrodes 44 and 45 are equivalent to the parallel plate electrode 42, samples can be etched simultaneously at the parallel plate electrodes 44 and 45, thereby making it possible to increase throughput for etching.

Figure 13:
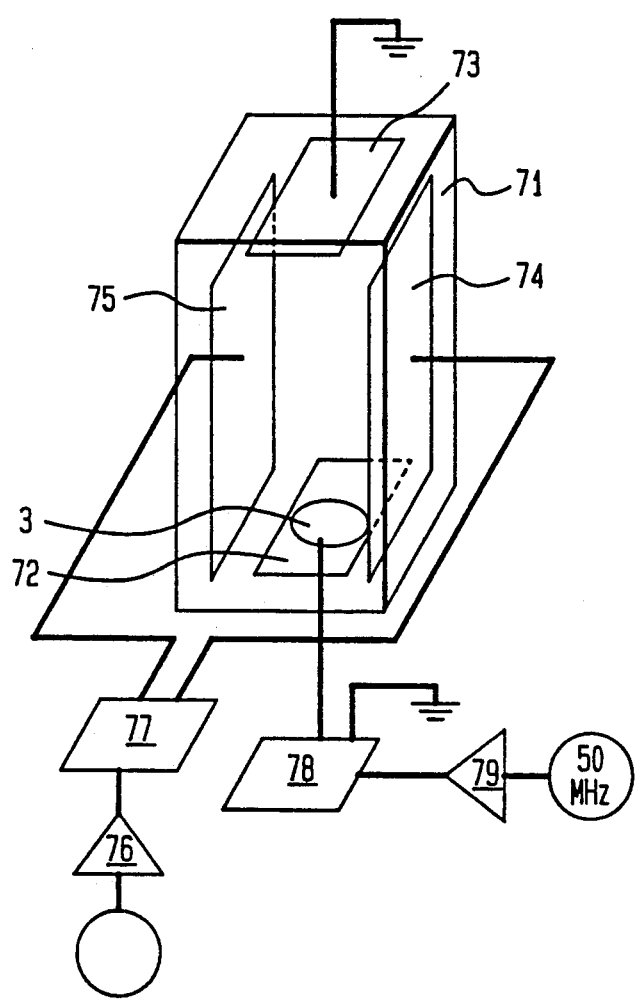
FIG. 13 is a diagram showing the configuration of a plasma etcher of a fourth embodiment according to the invention.
Figure 14:
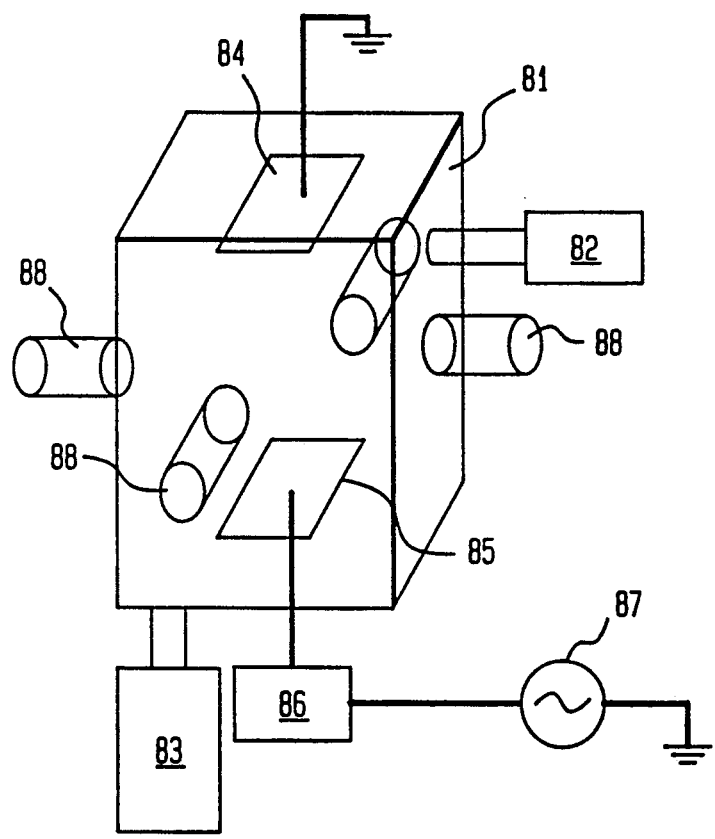
FIG. 14 is a diagram showing an RIE etcher employing a prior art magnetron discharge.

FIG. 13 shows a plasma etcher for dry etching of a fourth embodiment according to the invention. The plasma etcher comprises: an etching chamber (plasma chamber) 71; a pair of parallel plate electrodes 74 and 75; a temperature-controlled sample stage 72 serving as an parallel plate electrode on which a 50 MHz high-frequency power is applied; and a ground electrode 73 used as its opposing parallel plate electrode. On the two parallel plate electrode 74 and 75, a 300 MHz high-frequency power is applied. The sample stage 72 supports a sample (a semiconductor wafer to be etched) 3. The sample stage 72 is made the coldest part in the etching chamber and is maintained at 10 to −10 degrees. An amplifier 76 supplies a high-frequency power to the pair of parallel plate electrodes 74 and 75 via a matching circuit 77.

The etching gas is introduced into the chamber 71 through a mass flow controller (not shown) and an inlet (not shown). The internal pressure of the chamber is maintained at 0.1 to 30 Pa during etching by a turbo pump (not shown). In the space surrounded by the sample stage 72 and the parallel plate electrodes 73 to 75, the plasma is generated.

This embodiment differs from the first embodiment in that there is only one pair of parallel plate electrodes on which a 300 MHz high-frequency power is applied. Further, the parallel plate electrodes 74 and 75 are disposed outside the etching chamber via a quartz or ceramic material, whereby corrosion due to etching is avoided and metal contamination from the parallel plate electrodes 74 and 75 is prevented.

As described in conjunction with the first embodiment, the electrons are oscillated by a high-frequency power applied on the parallel plate electrodes 74 and 75, and a high ionization efficiency and high plasma density are obtained in spite of a low pressure. In order to increase the ionization efficiency, it is desirable to use a frequency higher than 50 MHz, but the effectiveness of the invention can still be confirmed at a lower frequency.

To etch aluminum in the plasma etcher, a gas containing $BCl_3+Cl_2$, $SiCl_4+Cl_2+CHCl_3$ or other chlorine gas as a base is used. The electric field between the parallel plate electrodes was uniform. Therefore, a plasma with good uniformity was obtained which yielded highly uniform etching. By making the sample stage 72 in this embodiment the coldest part in the etching chamber 71, the selectivity ratio to the photoresist (not shown) on the sample 3 is increased to above 5. Further, there are almost no local deviations in the plasma, so that damage to the sample 3 is very slight.

Application of the 50 MHz high-frequency power applied on the sample stage 72 is made so as to form a bias for changing the energy of the ions reaching the sample surface in order to control the selectivity ratio. For this reason, it is generally smaller than the high-frequency power applied on the parallel plate electrodes 74 and 75 by several tens of watts. Therefore, the amount of current flowing to the sample is only the amount required for etching and it can be smaller than the level required to maintain the plasma. By this means, damage due to charge-up is small when compared to cases in which the sample stage is used as a parallel plate electrode for supplying the high-frequency power required to maintain the plasma.

As described above, in this embodiment, a mechanism is employed in which a high-frequency power with a frequency greater than 50 MHz is applied on a pair of parallel plate electrodes 74 and 75 and a high-frequency power with a second frequency is applied on another pair of parallel plate electrodes 72 and 73. Thus, a high-density plasma with good uniformity can be obtained. Further, since there are almost no local deviations in the plasma, damage to the processed material is very slight.

The invention utilizes the phenomenon of the oscillation, revolution or cycloidal motion of electrons in a suitable high-frequency electric field and applies the high-density plasma, which is highly uniform over a large area, generated at a low pressure for etching. According to the invention, etching can be realized to form a superior fine patterning. Thus, the plasma etcher of the invention is highly suited to mass production. According to the invention, an excellent uniformity is attained, and it allows very little damage to devices such as gate oxide film breakdown, thus contributing greatly to the production of high-density semiconductor devices.

While the invention has been described in conjunction with the plasma etcher, the invention is applicable to a plasma CVD reactor, a plasma reactor for surface treatments and so on.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An apparatus for generating plasma comprising:
   a plasma chamber;
   a pair of electrodes for generating plasma in said plasma chamber;
   first power supply means for applying a first high-frequency power to said pair of electrodes, to produce an oscillation electric field in a space formed by said pair of electrodes;
   a holder for holding at least one wafer, said holder disposed in said plasma chamber and provided outside said space formed by said electrodes, said holder having a holding face which faces said space, said holding face being substantially parallel to the direction of said oscillation electric field; and
   second power supply means for applying a second high-frequency power to said holder, to supply said holder with a bias voltage,
   wherein the period of said first high-frequency power is shorter than the period of said second high-frequency power, and is shorter than the time required for electrons contained in said plasma to travel between said pair of electrodes.

2. An apparatus according to claim 1, wherein a distance between said electrodes is longer than a length between both ends of said holding face of said holder.

3. An apparatus according to claim 1, wherein said first high-frequency power has a frequency greater than 50 MHz.

4. An apparatus according to claim 1, wherein said pair of electrodes is provided inside said plasma chamber.

5. An apparatus according to claim 1, wherein said pair of electrodes is provided outside said plasma chamber.

6. An apparatus according to claim 1, further comprising temperature control means for regulating the temperature of said holder.

7. A plasma etcher comprising:
   a plasma chamber
   a pair of electrodes for generating plasma in said plasma chamber;
   first power supply means for applying a first high-frequency power to said pair of electrodes, to produce an oscillation electric field in a space formed by said pair of electrodes;
   a holder for holding at least one wafer, said holder disposed in said plasma chamber and provided outside said space formed by said electrodes, said holder having a holding face which faces said space, said holding face being substantially parallel to the direction of said oscillation electric field; and
   second power supply means for applying a second high-frequency power to said holder, to supply said holder with bias voltage,
   wherein the period of said first high-frequency power is shorter than the period of said second high-frequency power, and is shorter than the time required for electrons contained in said plasma to travel between said pair of electrodes.

8. A plasma etcher according to claim 7, wherein a distance between said electrodes is longer than a length between both ends of said holding face of said holder.

9. A plasma etcher according to claim 7, wherein said first high-frequency power has a frequency greater than 50 MHz.

10. A plasma etcher according to claim 7, wherein said pair of electrodes is provided outside said plasma chamber.

11. A plasma etcher according to claim 7, further comprising temperature control means for regulating the temperature of said holder.

* * * * *